(12) United States Patent
Kondo et al.

(10) Patent No.: US 8,601,188 B2
(45) Date of Patent: Dec. 3, 2013

(54) SEMICONDUCTOR DEVICE, CONTROL METHOD FOR THE SEMICONDUCTOR DEVICE AND INFORMATION PROCESSING SYSTEM INCLUDING THE SAME

(71) Applicant: Elpida Memory, Inc., Tokyo (JP)

(72) Inventors: Chikara Kondo, Tokyo (JP); Naohisa Nishioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/911,172

(22) Filed: Jun. 6, 2013

(65) Prior Publication Data

US 2013/0275798 A1    Oct. 17, 2013

Related U.S. Application Data

(63) Continuation of application No. 12/923,714, filed on Oct. 5, 2010, now Pat. No. 8,473,653.

(30) Foreign Application Priority Data

Oct. 9, 2009    (JP) .................................. 2009-235486

(51) Int. Cl.
  *G06F 13/28* (2006.01)
  *G06F 13/12* (2006.01)

(52) U.S. Cl.
  USPC ............................................ 710/71; 710/29

(58) Field of Classification Search
  None
  See application file for complete search history.

(56) References Cited

U.S. PATENT DOCUMENTS

| 7,123,497 | B2 | 10/2006 | Matsui et al. |
| 7,466,577 | B2 | 12/2008 | Sekiguchi et al. |
| 7,545,663 | B2 * | 6/2009 | Ikeda et al. ...................... 365/63 |
| 2008/0115021 | A1 | 5/2008 | Parulkar |

FOREIGN PATENT DOCUMENTS

| JP | 2004-327474 A | 11/2004 |
| JP | 2006-277870 A | 10/2006 |
| JP | 2007-157266 A | 6/2007 |

* cited by examiner

*Primary Examiner* — Matthew Bradley
*Assistant Examiner* — Zachary K Huson
(74) *Attorney, Agent, or Firm* — McGinn IP Law Group, PLLC

(57) ABSTRACT

The core chips each include a timing control circuit that outputs a timing signal synchronized with the outputting of parallel data to the interface chip. The interface chip includes a data input circuit that captures parallel data in synchronization with the timing signal. With this arrangement, the timing to output the parallel data and the timing to capture the parallel data are both synchronized with the timing signal generated in the core chips. Therefore, even if there is a difference in operation speed between each core chip and the interface chip, the parallel data can be accurately captured on the interface chip side.

12 Claims, 12 Drawing Sheets

SEMICONDUCTOR DEVICE, CONTROL METHOD FOR THE SEMICONDUCTOR DEVICE AND INFORMATION PROCESSING SYSTEM INCLUDING THE SAME

This application is a Continuation Application of U.S. patent application Ser. No. 12/923,714, filed on Oct. 5, 2010.

BACKGROUND OF THE INVENTION

1. Field of the Invention

The present invention relates to a semiconductor memory device and an information processing system including the same. More particularly, the present invention relates to a semiconductor memory device that includes plural core chips and an interface chip to control the core chips and an information processing system including the same.

2. Description of Related Art

A memory capacity that is required in a semiconductor memory device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there has been a further problem that it is difficult to speed up transistors in the front end unit.

As a method to resolve the above problem, a method that integrates the front end unit and the back end unit in individual chips and laminates these chips, thereby constituting one semiconductor memory device, is suggested (for example, Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common interface to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

However, since there occurs a deviation in operation speed among the core chips due to the manufacturing process conditions, the period of time from the receipt of a read command to the outputting of read data also varies among the core chips. As a result, the latch margin of the read data for the interface chip becomes smaller, and in some cases, read data cannot be accurately latched.

As a method for solving the above problem, FIGS. 11 and 13 of JP-A No. 2006-277870 disclose a method of reproducing a data strobe signal (DQS) that is output from a memory chip and is phase-delayed in an interface chip, and controlling the latch timing of read data on the interface chip with the use of the reproduced data strobe signal in a semiconductor device in which memory chips and the interface chip are stacked, though the semiconductor device is not of a type having a front-end unit and a back-end unit separated from each other. More specifically, as disclosed in paragraphs [0071] through [0073] of JP-A No. 2006-277870, data strobe signals DQS and /DQS supplied from the memory chips at the time of reading generate an internal strobe signal DQSI having a phase 90-degrees shifted from the data strobe signals DQS and /DQS, via each input buffer INB of a differential amplifier type and the strobe signal generating circuit DSG of the interface chip. The latch circuits L of the interface chip capture data DQ supplied from the memory chips, in synchronization with the internal strobe signal DQSI. The data DQ captured in the interface chip and the strobe signals DQS and /DQS are transmitted to the outside. Accordingly, when seen from outside the semiconductor memory device, the overall read latency is obtained by adding one clock that is the latency of the interface chip to the read latency RL of the memory chips, or RL+1.

This relates data latch timing in a semiconductor device having an interface chip added to conventionally known memory chips each operating independently of one another, and has been developed as a solution on the assumption that a delay is caused from the read latency of conventional memory chips as described above.

However, the semiconductor device disclosed in JP-A No. 2006-277870 is not a semiconductor device of a type having a front-end unit and a back-end unit separated from each other, but is a semiconductor device in which conventional memory chips operating independently of one another and an interface chip for relaying data and signals between the conventional memory chips and the outside are stacked. Therefore, the read data that are output from the memory chips are serial-converted data. The read data and the data strobe signals that are output from the memory chips be supplied directly to a controller chip (to the outside) in the case of a regular semiconductor device, and those data and signals are simply buffered by the interface chip. Due to this buffering, extra time is required for supplying read data to the controller chip in practice, and the access speed becomes lower when seen from the controller chip. As described above, the invention disclosed in JP-A No. 2006-277870 fundamentally differs from a semiconductor device of a type having a front-end unit and a back-end unit separated from each other. Therefore, it is difficult for the invention disclosed in JP-A No. 2006-277870 to solve the above described problem.

SUMMARY

In one embodiment, there is provided a semiconductor device that includes at least one core chip that outputs parallel data that is a plurality of parallel bits, and an interface chip that converts the parallel data supplied from the core chip into serial data that is a plurality of series bits, and outputs the serial data to the outside. The core chip includes a timing control circuit that outputs a timing signal synchronized with an output of the parallel data to the interface chip. The interface chip includes a data input circuit that captures the parallel data in synchronization with the timing signal generated in the core chip.

In one embodiment, there is provided a method for controlling a semiconductor device that includes at least one core chip that outputs parallel data that is a plurality of parallel bits, and an interface chip that converts the parallel data supplied from the core chip into serial data that is a plurality of series bits, and outputs the serial data to the outside. The method includes a process of generating a timing signal in the core chip and output the timing signal to the interface chip, a process of outputting the parallel data from the core chip to the interface chip in synchronization with a timing signal and a process of capturing the parallel data in the interface chip in synchronization with the timing signal generated in the core chip.

In another embodiment, there is provided a data processing system that includes the semiconductor device as described above and a controller that is connected to the semiconductor device. The controller issues a command related to a read command, to the interface chip. The interface chip issues the read command to the core chips, upon receipt of the read command from the controller. One of the core chips outputs the parallel data corresponding to the read command to the interface chip, upon receipt of the read command. The interface chip converts the parallel data into the serial data and outputting the serial data to the controller, upon receipt of the parallel data from one of the core chips.

According to the present invention, the timing to output parallel data from each core chip and the timing to capture parallel data into an interface chip are both synchronized with a timing signal generated in each core chip. Accordingly, even if there are differences in operation speed among the core chips and/or there are differences in operation speed between the core chips and the interface chip due to the manufacturing conditions and the likes, the parallel data that are output from each core chip can be accurately captured on the interface chip side. Furthermore, there is no need to perform fine adjustment so that the timings to output parallel data match each other on the core chip, or perform fine adjustment so that the timings to capture the parallel data that are output from the respective core chips match each other on the interface chip, based on the differences in operation speed. Accordingly, the above advantageous effects can be achieved with a relatively simple circuit structure. Also, there is not a delay caused in the entire semiconductor device due to a further phase delay of the core chip signal information in the interface chip as in JP-A No. 2006-277870.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The following is a typical example of the technical concept of the present invention to solve the above mentioned problems. However, the contents claimed in this application are not limited to the technical concept, and are of course disclosed in the claims of this application. Specifically, the present invention is based on the technical concept by which a timing signal for defining the timing to output parallel data from the core chip side is output together with the parallel data to the interface chip, and the timing (latch timing) to allow inputting of the parallel data on the interface chip side in synchronization with the timing signal is defined. Accordingly, even if there are differences in operation speed among the core chips and/or there are differences in operation speed between the core chips and the interface chip due to the manufacturing conditions and the likes, the parallel data that are output from the respective core chips can be accurately captured on the interface chip side. Furthermore, there is no need to perform fine adjustment so that the timings to output parallel data become uniform on the core chip side, or perform fine adjustment so that the timings to capture the parallel data that are output from the respective core chips become uniform on the interface chip side, based on the differences in operation speed. Accordingly, the above advantageous effects can be achieved with a relatively simple circuit structure. Also, there is not a delay caused in the entire semiconductor device due to a further phase delay of the core chip signal information in the interface chip as in JP-A No. 2006-277870.

Preferred embodiments of the present invention will be explained below in detail with reference to the accompanying drawings.

Figure 1:
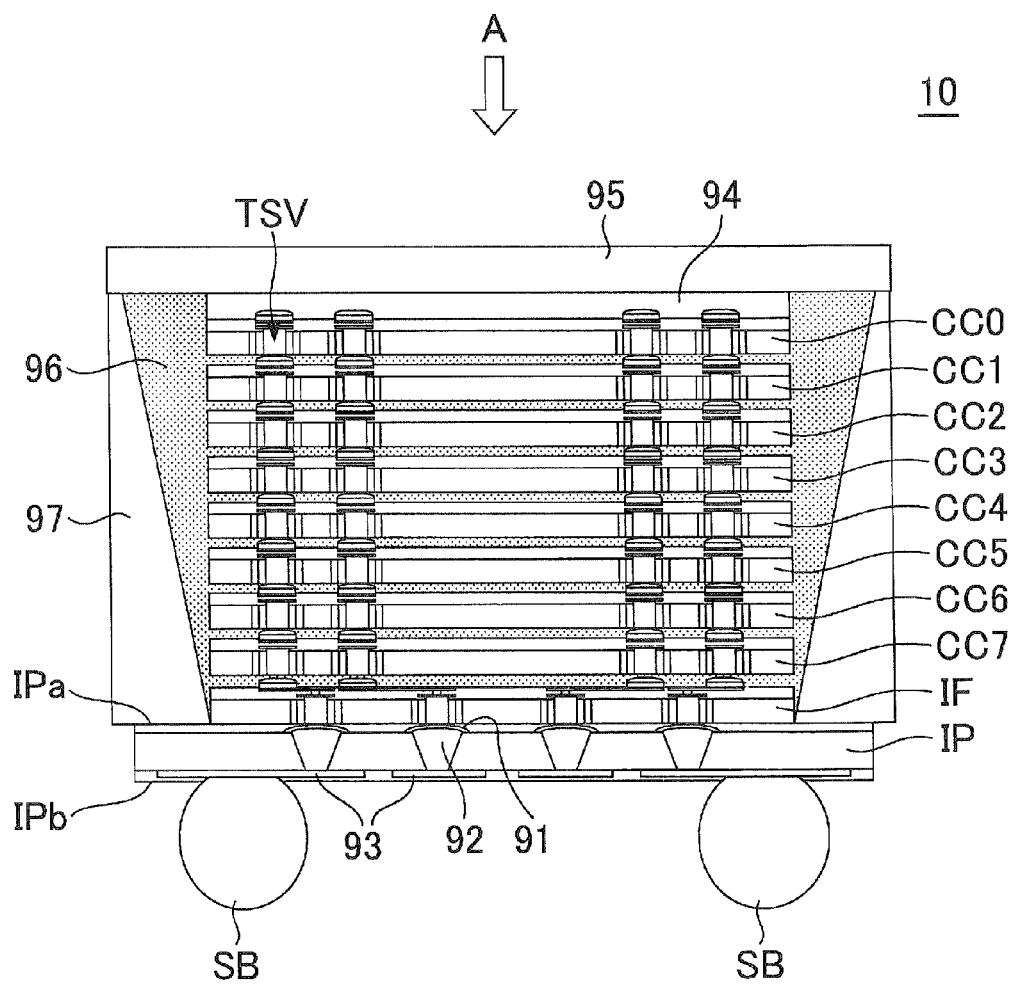
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation.

Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a read frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
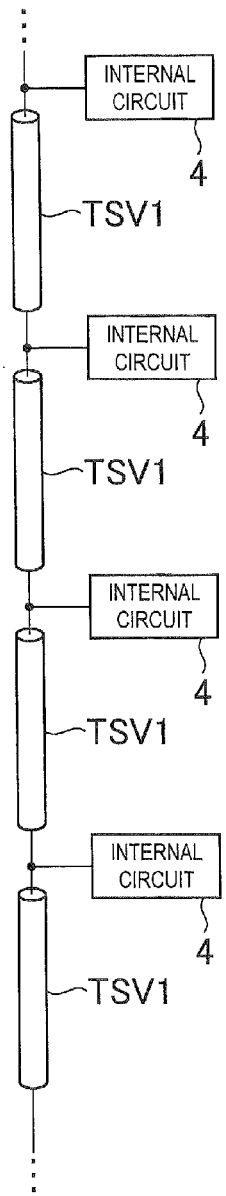
FIGS. 2A to 2C are diagram showing the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits 4 in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
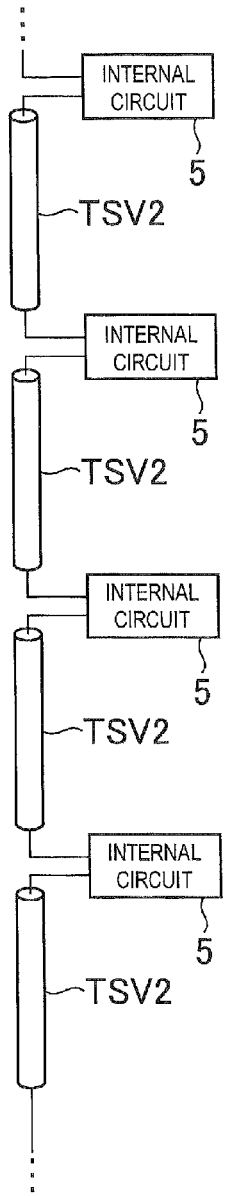

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits 5 that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Figure 2C:
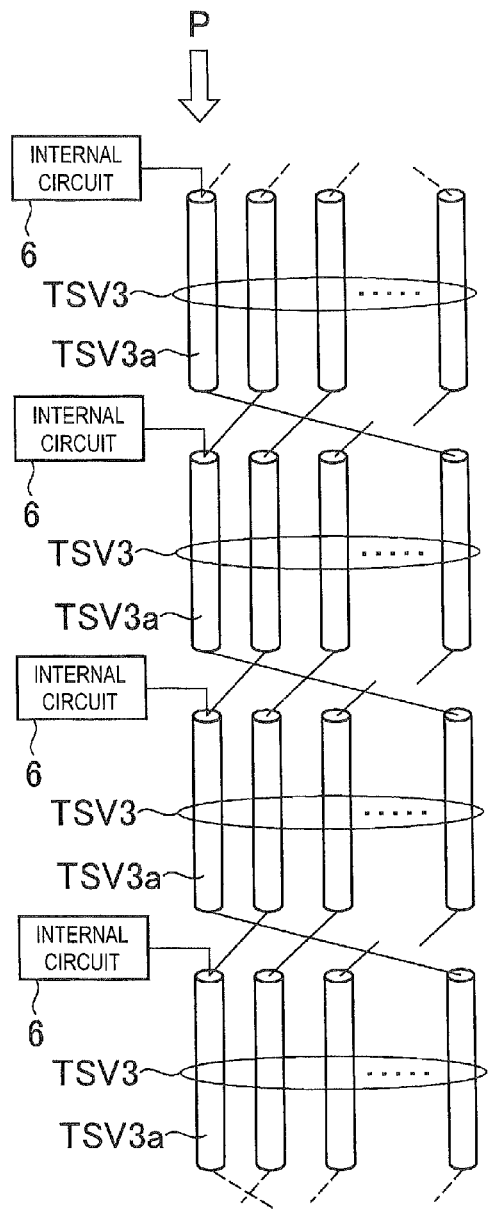

Another TSV group is short-circuited from the TSVs of other layer provided at the different position in plain view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
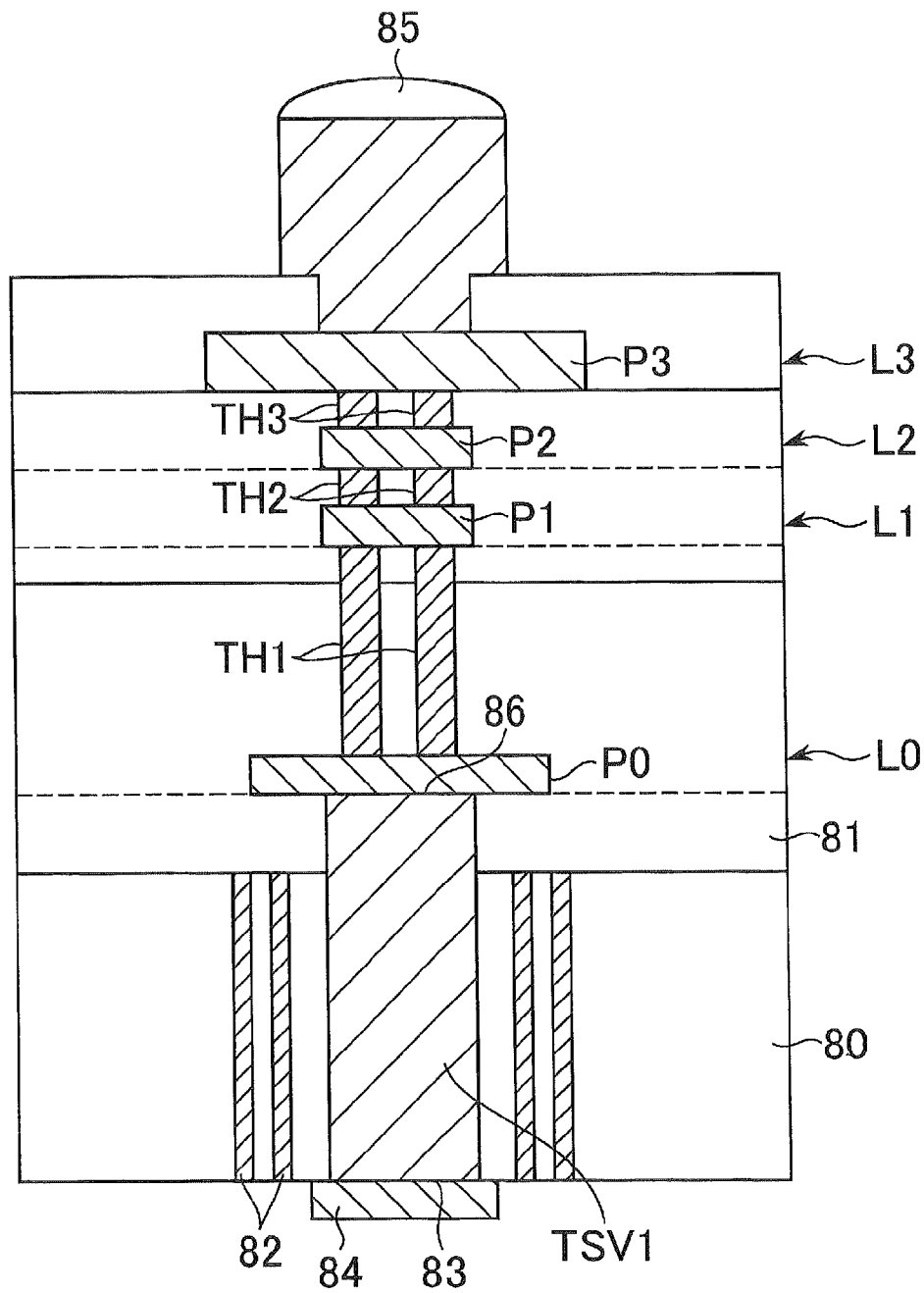
FIG. 3 is a cross-sectional view illustrating the structure of the TSV1 of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
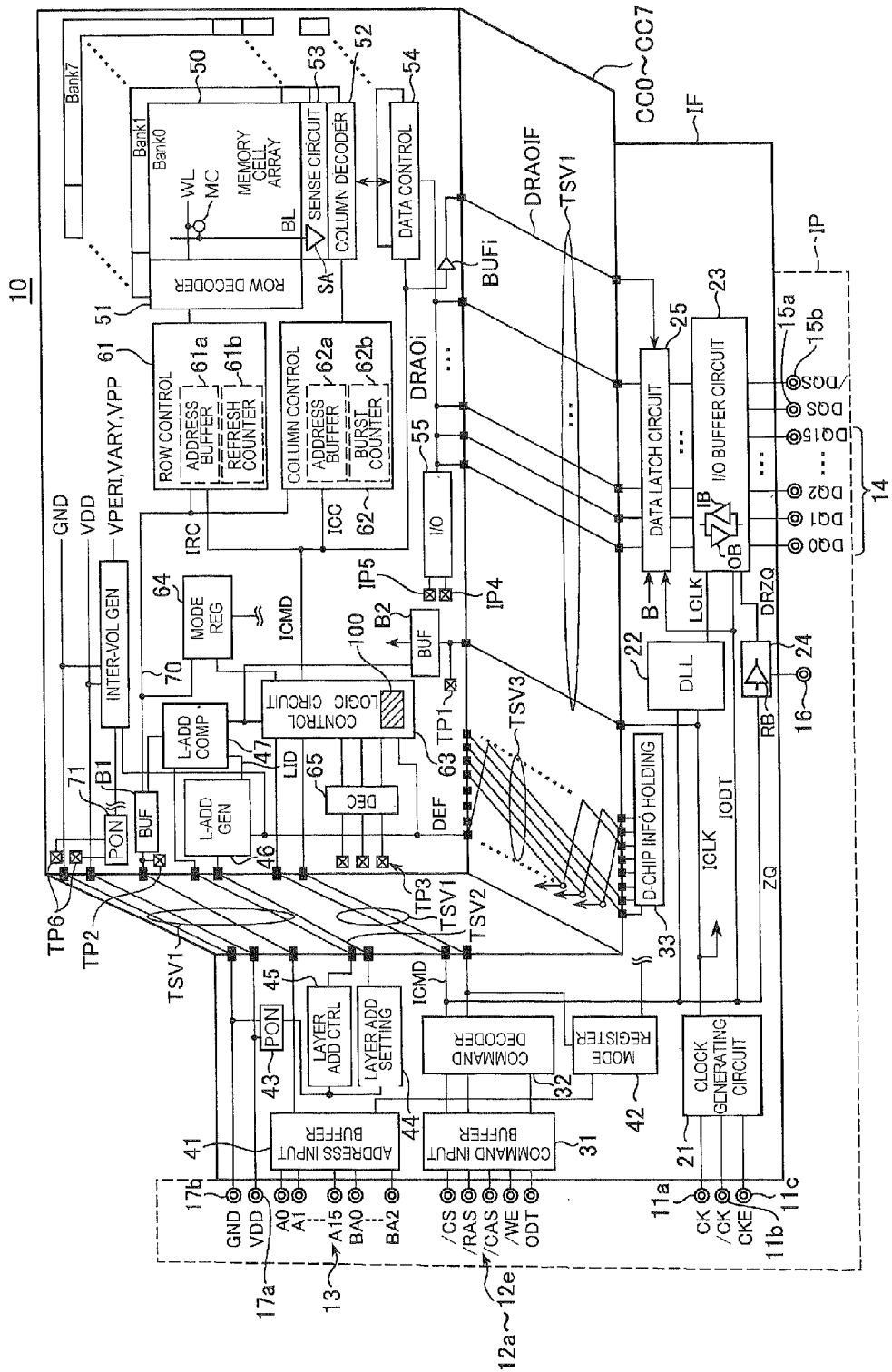
FIG. 4 is a block diagram illustrating the circuit configuration of the semiconductor memory device.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit is connected to the core chips CC0 to CC7 while being shifted, using the TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. As shown in FIG. 4, the control logic circuit 63 includes the timing control circuit 100. The timing control circuit 100 generates the timing signal DRAOi (i is chip number from 0 to 7). The timing signal DRAOi is supplied to the data control circuit 54 and the buffer BUFi (i=0-7). The buffer BUFi supplies the timing signal DRAOIF to the data latch circuit 25 included in the interface chip IF, via TSV1, type of which is shown in FIG. 2A. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46. When the SEL matches LID, the matching signal HIT is activated.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. In this embodiment, the core chips CC0 to CC7 are provided with some test pads TP. An address signal and test data or a command signal can be input from the test pads TP.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
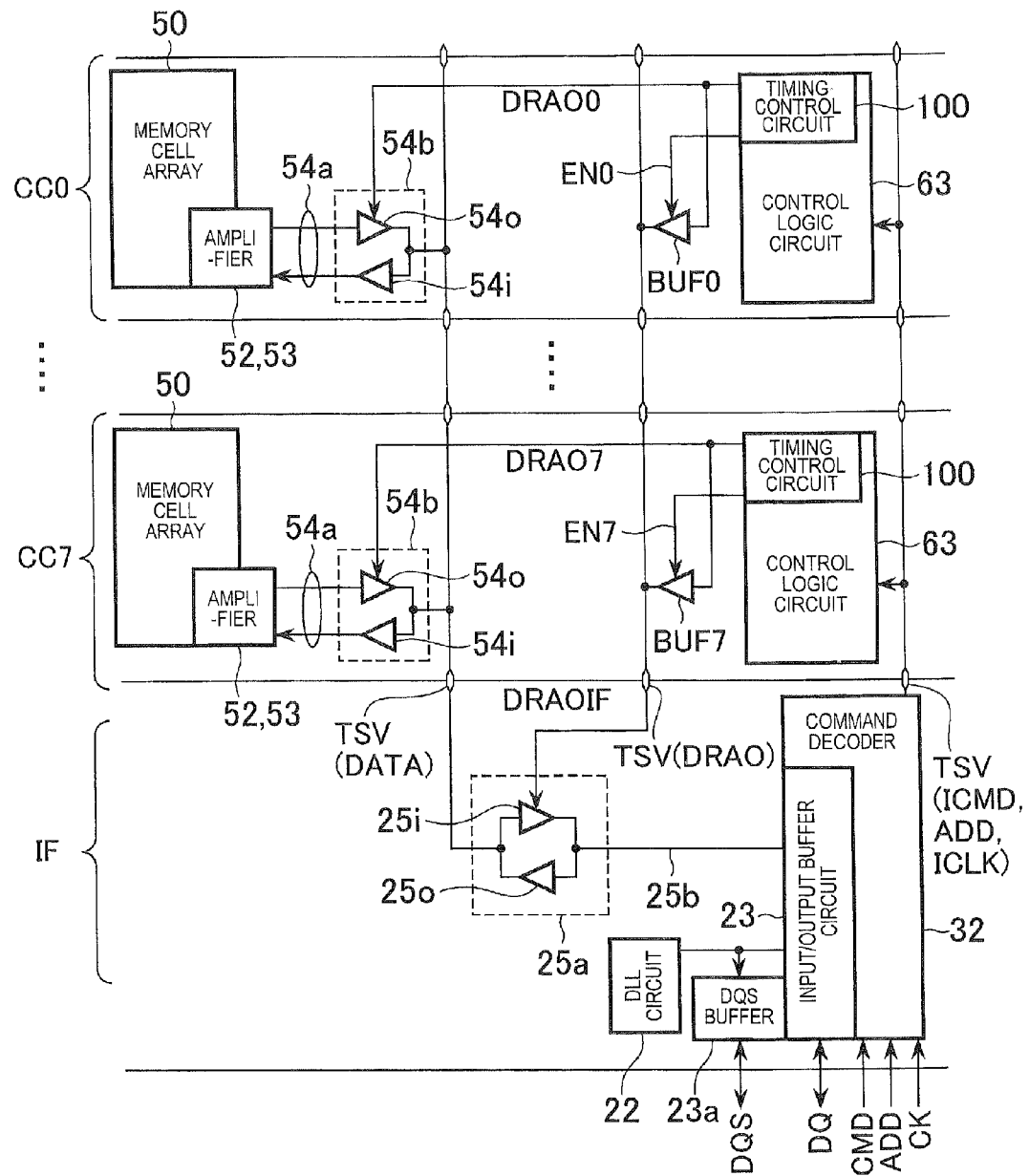
FIG. 5 is a block diagram according to the first embodiment.

FIG. 5 is a schematic view that relates to a read command transmitted from the interface chip IF to the respective core chips and is made for explaining the flow of parallel read data (parallel data) from the core chips CC0 through CC7 to the interface chip IF, illustrating a first embodiment of the present invention. In FIG. 5, only one bit of the parallel read data (parallel data) is shown (the same goes for the later described FIGS. 7, 9, and 10).

Although the read command and the address signal concerning the read command are commonly supplied from the interface chip IF to the respective core chips CC0 through CC7, only one of the core chips CC0 through CC7 outputs read data to the interface chip IF, and two or more of the core chips CC0 through CC7 do not simultaneously output read data. Therefore, in the read data transfer from the core chips utilizing TSV1 of the type illustrated in FIG. 2A to the interface chip IF, no data collisions occur. One of the core chips CC0 through CC7 is selected by the layer address comparator circuit 47 comparing an address signal supplied from the interface chip IF with the layer address set in each of the core chips CC0 through CC7.

As shown in FIG. 5, a TSV buffer 54b in the data control circuit 54 in each core chip includes a data output circuit 54o and a data input circuit 54i. The input terminal of the data output circuit 54o and the output terminal of the data input circuit 54i are connected to various amplifiers included in the sense circuit 53 and the column decoder 52 via read/write buses 54a, and are lastly connected to the memory cell array 50.

The timing signal DRAOi (i=0 through 7) is supplied to the data output circuit 54o from the timing control circuit 100 in the control logic circuit 63. In other words, the data output circuit 54o is a clocked driver that is controlled by the output timing signal DRAOi. The output timing signal DRAOi is the signal for designating an operation timing of the data output circuit 54o (or the signal for outputting the read data signal on the read/write buses 54a read from the memory cell array 50 to the TSV).

The parallel read data (a read data signal) that is input to the interface chip IF via the TSV is supplied to a data input circuit 25i included in a TSV buffer 25a. The TSV buffer 25a also includes a data output circuit 25o. The input terminal of the data output circuit 25o and the output terminal of the data input circuit 25i are connected to the input/output buffer circuit 23 via a read/write bus 25b. The data input circuit 25i of the interface chip IF is activated when the semiconductor device 10 inputs read data from the core chips and outputs the read data to the outside, and the data output circuit 25o is activated when the semiconductor device 10 inputs write data from the outside and outputs the write data to the core chips.

The timing signal DRAOIF of the interface chip IF is supplied to the data input circuit 25i. Specifically, the data input circuit 25i is a clocked receiver that is controlled by the input timing signal DRAOIF. The timing signal DRAOIF is the signal for designating the timing (the capture timing) to allow capturing of read data that are output from the core chips to the interface chip IF via TSVs. The timing signal DRAOIF is supplied from the core chips CC0 through CC7 having output the read data concerning the read commands via TSVs. More specifically, the output timing signal DRAGi for controlling the clocked drivers of the core chips is supplied to the interface chip IF via TSVs (DRAG; clock) different from the TSVs for transferring the read data.

As shown in FIG. 5, the core chips CC0 through CC7 respectively include buffers BUF0 through BUF7 that receive the timing signal DRAGi. The outputs of the buffers BUF0 through BUF7 that are wire-ORed by the TSV1 of the type illustrated in FIG. 2A are used as the timing signal DRAOIF for controlling the clocked receiver of the interface chip IF. The respective buffers BUF0 through BUF7 are selectively activated by corresponding enable signals EN0 through EN7, and the output of a buffer BUFi becomes high impedance if the corresponding enable signal ENi is in an inactive state. The enable signals EN0 through EN7 each contain the layer address LID (the chip identification information).

With this structure, the internal operation speed varies depending on the manufacturing conditions and the likes of the respective core chips CC0 through CC7, and the specific timings to output read data from the core chips via the respective data output circuits 54o at the specific operation speeds are certainly synchronized with the respective capture allowing timings (the capture timings) to input sets of read data that are output at the specific timings in the data input circuit 25i in the interface chip IF.

Figure 6:
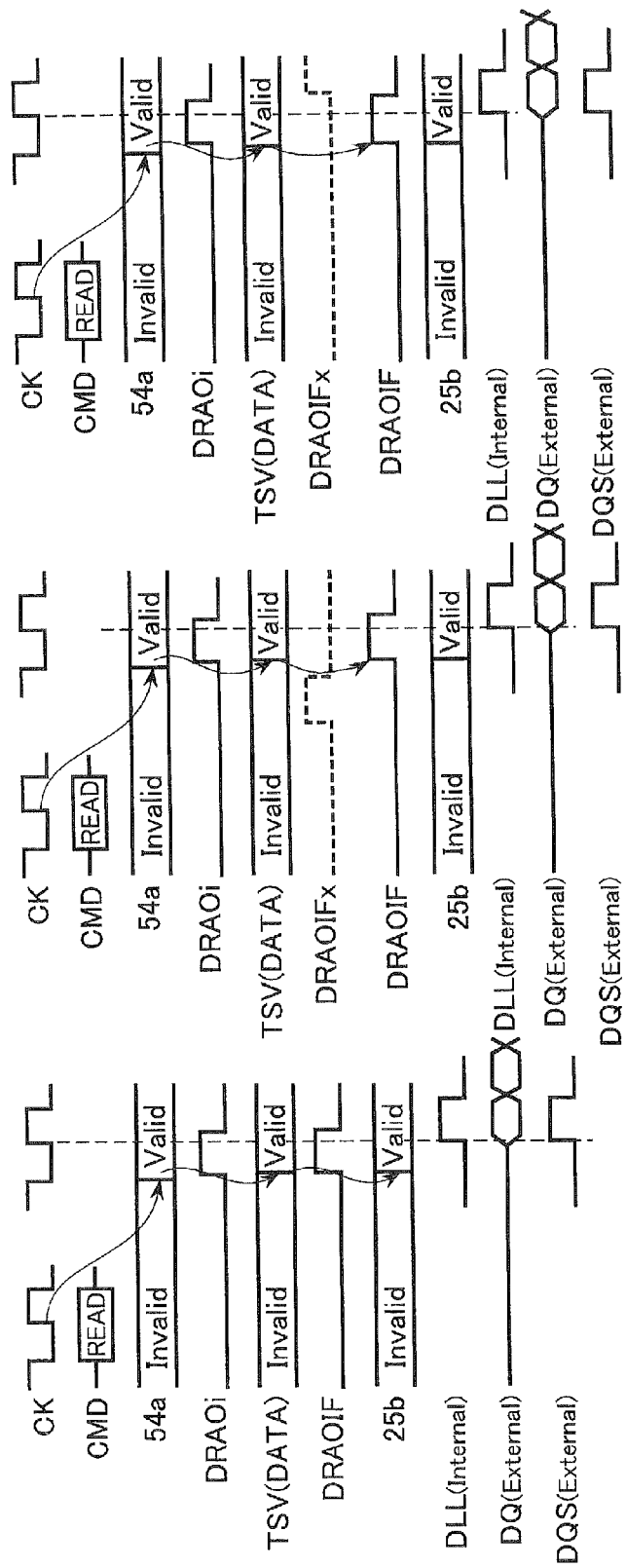
FIGS. 6A to 6C are timing charts for explaining the advantageous effects of the first embodiment.

FIGS. 6A through 6C are timing charts for explaining the advantageous effects of this embodiment.

As shown in FIG. 6A, a read command (READ) is issued from outside the semiconductor device 10, and the interface chip IF sends a command related to the read command to the corresponding core chip. After a predetermined period of time has passed since the read command, effective read data appears on the read/write bus 54a in the core chip. When the effective read data appears, the timing signal DRAOi (i=0 through 7) is activated, and, upon the activation, the read data is transferred to the interface chip IF via the TSV (DATA) for transmitting read data. In synchronization with this, the timing signal DRAOi in the core chip is transferred as the timing signal DRAOIF to be used in the interface chip IF. Therefore, the input buffer 25i in the interface chip IF immediately allows capture of the read data supplied via the TSV (DATA). As a result, effective read data appears on the read/write but 25b in the interface chip IF. The effective read data on the read/write bus 25b is parallel-serial converted in the input/output buffer circuit 23, and is then output as the read data DQ to the outside the semiconductor device 10. The read data DQ output to the outside and the data strobe signal DQS corresponding to the read data DQ are synchronized with the input/output clock signal LCLK that controls a front end of the semiconductor device 10 different from the one controlled by the timing signal DRAOIF, and is completely synchronized with an external clock CK of the semiconductor device 10 by the DLL. The data strobe signal DQS is generated from the same circuit as the generator circuit mounted on a known regular semiconductor device having its front end and back end included in one silicon chip.

In comparison with the case illustrated in FIG. 6A, a timing signal DRAOIFx that is generated in the interface chip IF is indicated by a broken line in each of FIGS. 6B and 6C. FIG. 6B illustrates a case where the operation speed of the interface chip IF is higher than the operation speed of the core chips CC0 through CC7, and as a result, the timing to activate the timing signal DRAOIFx becomes too early. If such a timing signal DRAOIFx is used to capture read data transmitted from a core chip, the input buffer 25i of the interface chip IF is activated before the effective read data arrives at the interface chip IF from the core chip. Therefore, there is a probability that wrong data is captured. FIG. 6C illustrates a case where the operation speed of the interface chip IF is lower than the operation speed of the core chips CC0 through CC7, and as a result, the timing to activate the timing signal DRAOIFx is too late. If such a timing signal DRAOIFx is used to capture read data transmitted from a core chip, a delay is caused in the timing to output the read data to the read/write bus 25b of the interface chip IF. Therefore, there is a probability that the read data is output to the outside the semiconductor device 10 later than it should be. Also, when sets of parallel read data (parallel data) are transmitted from core chips to the interface chip IF in chronological order, wrong data might be captured as in the case illustrated in FIG. 6B.

In this embodiment, on the other hand, the timing signal DRAOIF for controlling the clocked driver of the interface chip IF is generated based on the timing signal DRAOi (i=0 through 7) that is generated in the core chips CC0 through CC7 and controls the clocked driver. The latch timing of the input buffer 25i (a clocked receiver) is activated in synchronization with the timing signal DRAOIF. Accordingly, a difference in control timing between the clocked driver and the clocked receiver due to the difference in manufacturing conditions between the core chips and/or the difference in manufacturing conditions between the core chips and the interface chip as described above is not caused in principle. Thus, read data can be captured in the interface chip IF in accurate timing without a delay.

The TSVs (DATA) and the TSVs (DRAG: clock) are preferably placed physically close to one another. In other words, the clocked drivers, the clocked receiver, and the buffers BUF should preferably be placed close to one another. When a plurality of TSVs (DATA) are provided for transferring various data, it is preferable to place the TSVs (DATA) and the TSVs (DRAG: clock) close to one another. Through this configuration, the accuracy of the latch timing of the clocked receiver becomes higher.

Figure 7:
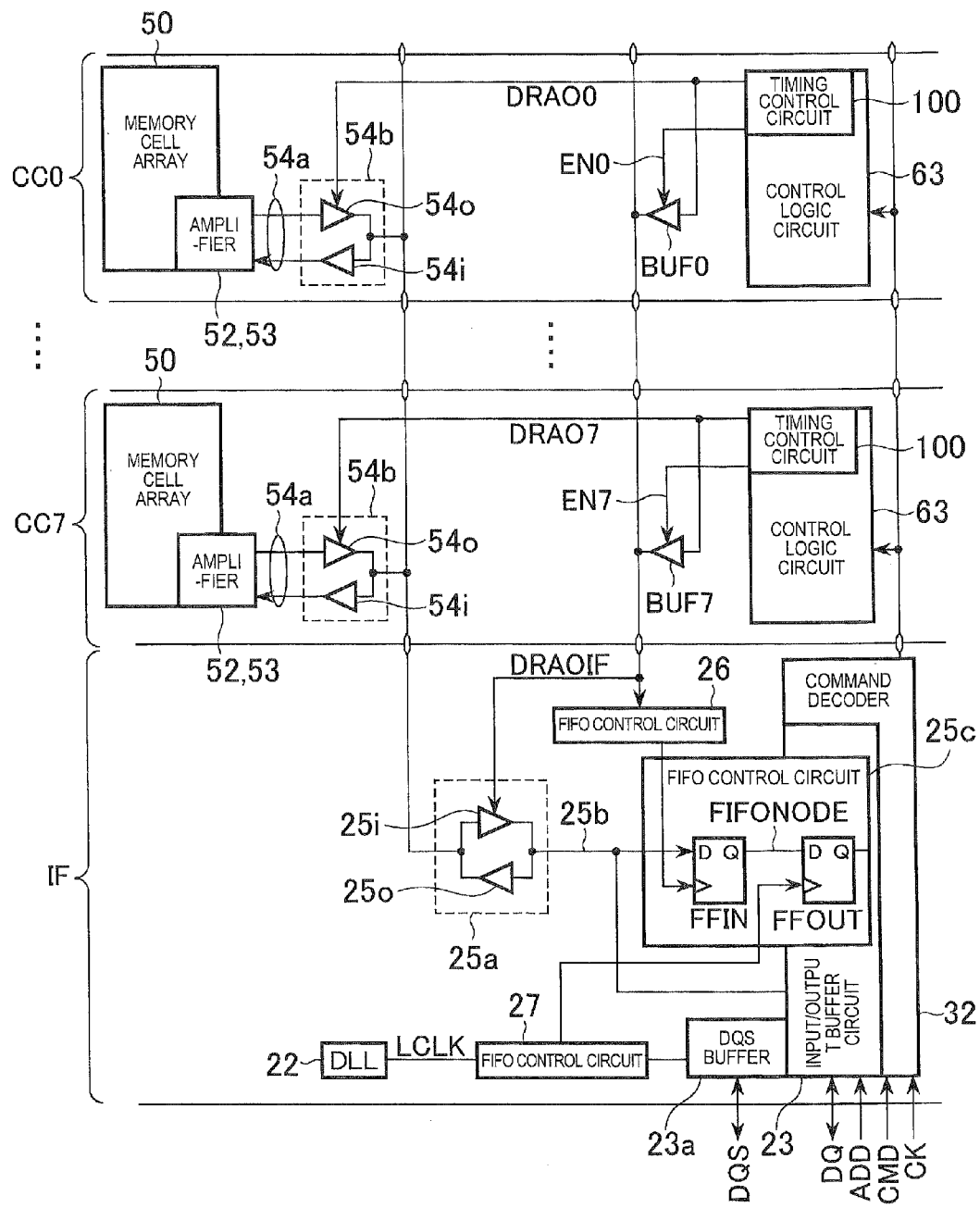
FIG. 7 is a block diagram illustrating a second embodiment of the present invention.
Figure 8:
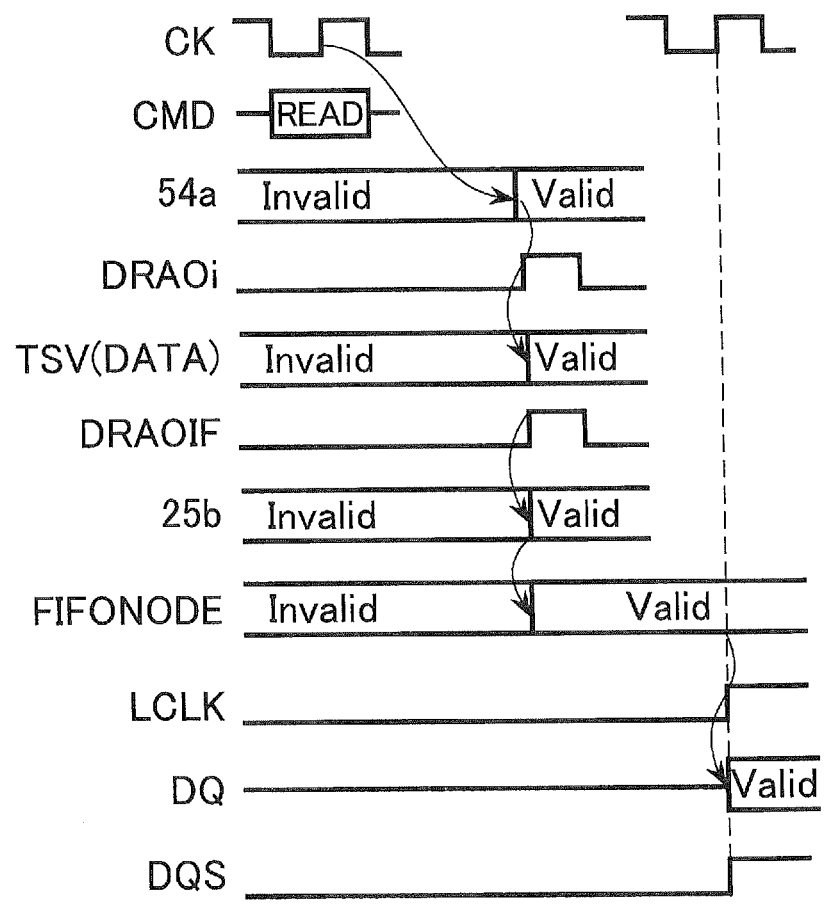
FIG. 8 is a timing chart for explaining an operation in the second embodiment.

FIG. 7 is a block diagram illustrating a second embodiment of the present invention. FIG. 8 is a timing chart for explaining an operation in the second embodiment.

The aspects of the second embodiment that differ from the first embodiment are mainly described herein. In this embodiment, FIFO circuits 25c are provided in the interface chip IF. The FIFO circuits 25c are circuits that are connected between the read/write bus 25b and the input/output buffer circuit 23, and are formed with flip-flop circuits (latch circuits) connected in cascade. The FIFO circuits 25c are used when the timing to output read data to the outside needs to be changed with latency. In the example illustrated in FIG. 7, two flip-flop circuits FFIN and FFOUT are cascade-connected in this order. The first-stage flip-flop circuit FFIN latches the read data on the read/write bus 25b, and its latch timing is controlled by a FIFO control circuit 26. The last-stage flip-flop circuit FFOUT latches the read data to be output to the input/output buffer circuit 23, and its latch timing is controlled by a FIFO control circuit 27. The flip-flop circuits FFIN and FFOUT are connected at a connecting point FIFONODE.

As shown in FIG. 7, the timing signal DRAOIF is supplied to the FIFO control circuit 26, and accordingly, the latch timing of the first-stage flip-flop circuit FFIN is also synchronized with the timing signal DRAOIF. With this arrangement, not only the timing to capture read data by the input buffer 25i but also the timing to latch data to the FIFO circuits 25c is synchronized with the timing signal DRAOIF. Accordingly, the timing in which read data appears at the connecting point FIFONODE is also synchronized with the timing signal DRAOIF, as shown in FIG. 8.

Here, the FIFO circuits 25c are circuits with known first-in first-out functions. The outputs of the FIFO circuits 25c are connected to a multiplexer MUX connected to the input/output buffer circuit 23. The FIFO circuits 25c operate while latency control is performed to realize a known DDR function, and a latency control signal (not shown) for realizing the latency control is input to the FIFO control circuit 26. The latency control signal controls the FIFO circuits 25c in synchronization with the timing signal DRAOIF. Accordingly, in the second embodiment, the timing signal DRAOIF also controls the input timing of the FIFO circuits 25c as well as the timings controlled in the first embodiment. Thus, the latch timing of the clocked receiver (the input buffer 25i) and the timing to input the latched read data to the FIFO circuits 25c can be accurately realized.

Meanwhile, the operation timing of the FIFO control circuit 27 is synchronized with the input/output clock signal LCLK that is the output of the DLL circuit 22. Accordingly, as shown in FIG. 8, the latching operation of the last-stage flip-flop circuit FFOUT is performed in synchronization with the input/output clock signal LCLK. The output of the FIFO control circuit 27 is supplied to the DQS buffer 23a, so that the timing to output the data strobe signal DQS is also controlled. The circuit that generates the data strobe signal DQS is a known circuit.

Figure 9:
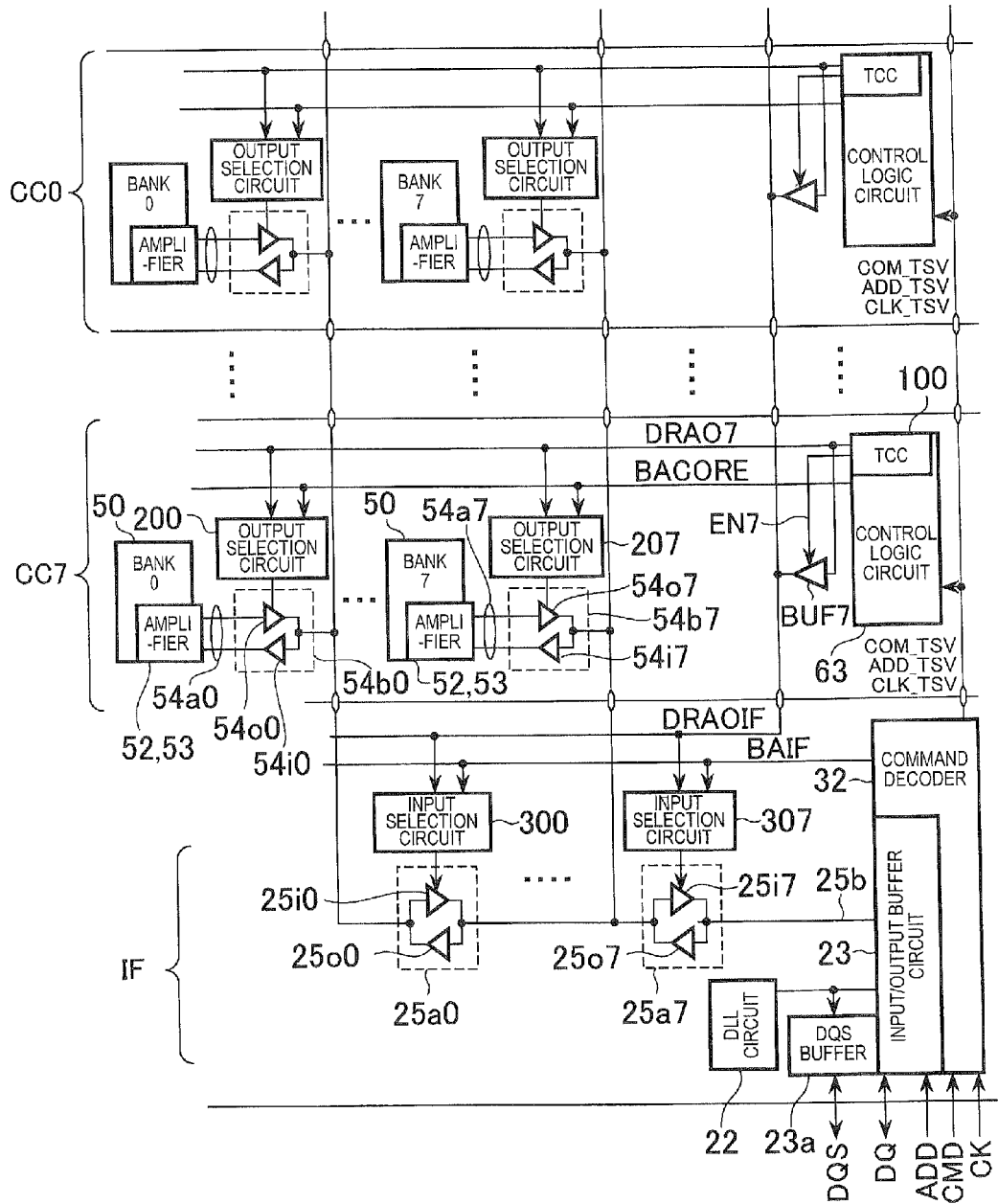
FIG. 9 is a block diagram illustrating a third embodiment of the present invention.

FIG. 9 is a block diagram illustrating a third embodiment of the present invention.

The aspects of the third embodiment that differ from the first embodiment are mainly described herein. This embodiment is an embodiment preferred in a case where parallel read data (parallel data) that are output from banks are supplied to the interface chip IF via TSVs (DATA) different from one another. In this embodiment, banks are provided in each of the respective core chips CC0 through CC7, and TSV buffers 54b (54b0 through 54b7) corresponding to the respective banks are provided. Also, TSV buffers 25a (25a0 through 25a7) corresponding to the respective banks are also provided in the interface chip IF. The outputs of the respective TSV buffers 54b (54b0 through 54b7) of the core chips CC0 through CC7 are wire-ored by TSV1 of the type illustrated in FIG. 2A. Therefore, the number of sets of the TSV buffers 25a (25a0 through 25a7) in the interface chip IF is one, regardless of the number of core chips.

As shown in FIG. 9, output selection circuits 200 through 207 corresponding to the respective banks are allotted to the TSV buffers 54b0 through 54b7 in the core chips. The timing signal DRAOi (i=0 through 7) and a bank address BACORE are supplied to the output selection circuits 200 through 207. If the bank address BACORE indicates the bank, the timing signal DRAOi (i=0 through 7) is supplied to the corresponding data output circuits 54o0 through 54o7. In this manner, the read data of the selected bank is output to the interface chip IF via the TSV (DATA).

In the interface chip IF, on the other hand, the TSV buffers 25a0 through 25a7 are serial-connected. More specifically, the output terminal of a TSV buffer 25aj (j=0 through 6) is connected to the input terminal of the next-stage TSV buffer 25aj+1. The output of the TSV buffer 25a7 is connected to the input/output buffer circuit 23 via the read/write bus 25b. Input selection circuits 300 through 307 are allotted to the respective TSV buffers 25a0 through 25a7. The timing signal DRAOIF and a bank address BAIF are supplied to the input selection circuits 300 through 307. In a case where the bank address BAIF indicates the value of the bank or a value allotted to a TSV buffer of a previous stage, the timing signal DRAOIF is supplied to the corresponding ones of the data input circuits 25i0 through 25i7. For example, the read data of the bank 0 that is output from a core chip to the interface chip is transmitted to the read/write bus 25b via the data input circuit 25i0 and the data input circuits 25i1 through 25i7. The corresponding input selection circuits 300 through 307 are all active. The read data of the bank 7 that is output from a core chip to the interface chip is transmitted to the read/write bus 25b only via the data input circuit 25i7. Only the corresponding input selection circuit 307 is active, and the other input selection circuits 300 through 306 are inactive. In a case where the corresponding input selection circuits through 307 are inactive, the data input circuits 25i0 through 25i7 each have the output of the data input circuit 25i controlled to high impedance. More specifically, a circuit structure is designed, and control is performed in such a manner that the output terminal of a data input circuit 25i of a previous stage does not fight over the bus with the read data of the TSV (DATA) to be input to the input terminal of a data input circuit 25i of a later-stage. With this arrangement, the read data supplied from the core chips CC0 through CC7 are eventually output to the read/write bus 25b of the interface chip IF.

With this structure, the read data read from the respective banks are supplied to the interface chip IF via the TSVs (DATA) different from one another, and are then supplied to the same read/write bus 25b in the interface chip IF. The data input circuits 25i0 through 25i7 (clocked receivers) provided for the respective banks are controlled by the timing signal DRAOIF generated from the timing signal DRAOi output from the core chips. Accordingly, the accuracy of the latch timing of the clocked receiver becomes higher.

Figure 10:
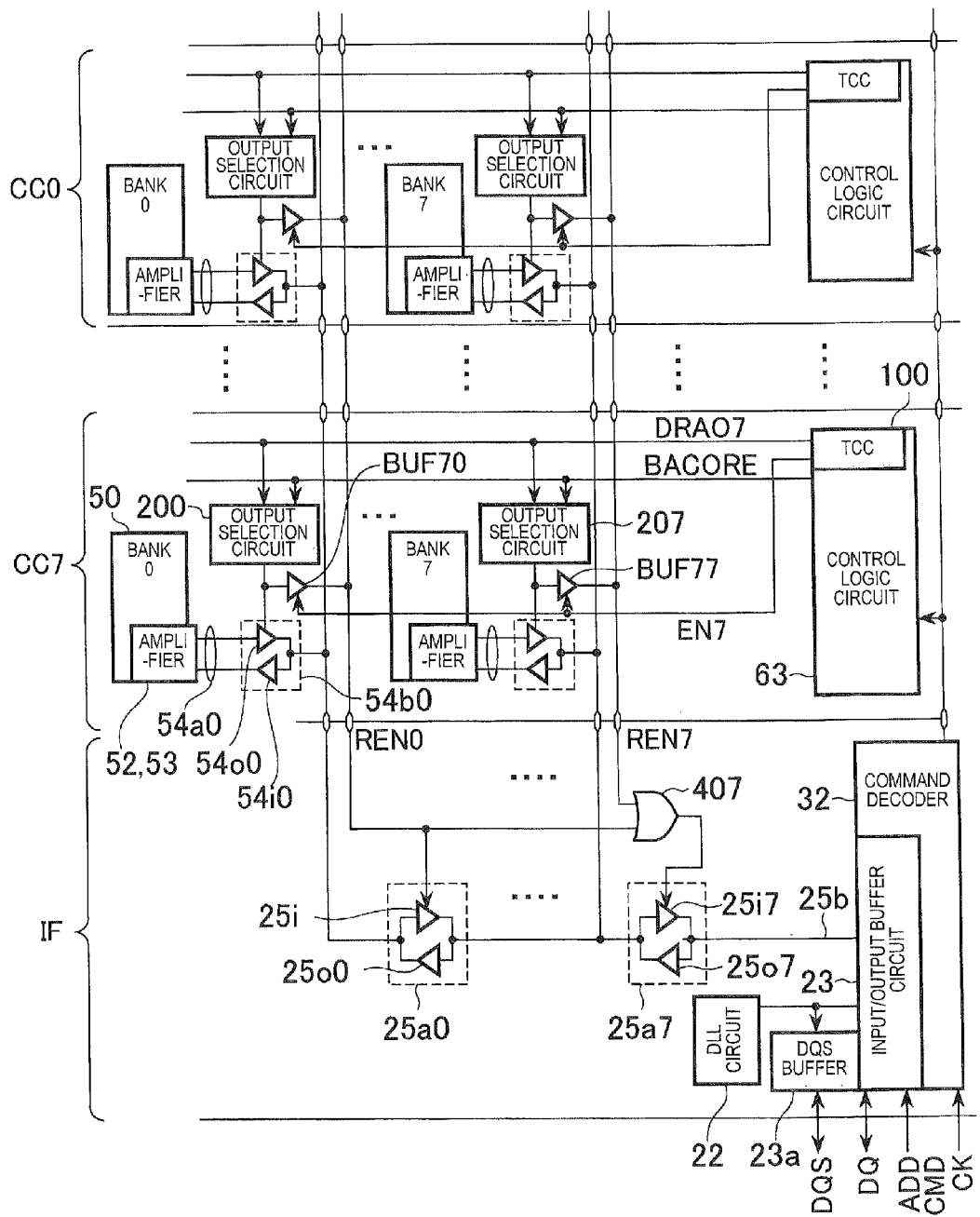
FIG. 10 is a block diagram illustrating a fourth embodiment of the present invention.

FIG. 10 is a block diagram illustrating a fourth embodiment of the present invention.

The aspects of the fourth embodiment that differ from the third embodiment are mainly described herein. This embodiment is another embodiment preferred in a case where parallel read data (parallel data) that are output from banks are supplied to the interface chip IF via TSVs (DATA) different from one another. In this embodiment, the TSV buffers 54b (54b0 through 54b7) corresponding to the respective banks are also provided in each of the core chips CC0 through CC7. Also, the TSV buffers 25a (25a0 through 25a7) corresponding to the respective banks are also provided in the interface chip IF.

As shown in FIG. 10, in this embodiment, the outputs of the output selection circuits 200 through 207 provided in the core chips are input to buffers BUFik (i representing the chip numbers of 0 through 7, k representing the bank numbers of 0 through 7). The outputs of the buffers BUFik are wire-ored at the corresponding TSVs (REN; clock) for the respective banks, and are supplied as enable signals RENk (k=0 through 7) from the core chips to the interface chip IF. The buffers BUFik are selectively activated by the corresponding enable signals EN0 through EN7, and the outputs are high impedances in an inactive state.

The interface chip IF is the same as that of the embodiment illustrated in FIG. 9 in that the TSV buffers 25a0 through 25a7 are serial-connected, but differs from that of the embodiment illustrated in FIG. 9 in that bank addresses are not input to an input selection circuit 407. The input selection circuits through 407 in this embodiment are OR gate circuits each receiving the corresponding enable signal REN and the enable signal REN corresponding to the data input circuit of a previous stage. The input selection circuits 401 through 406 are not shown in the drawing. The enable signal REN0 and VSS are input to the input selection circuit 401. The enable signals REN0 and REN1 are input to the input selection circuit 402. The output of the input selection circuit 402 and the enable signal REN2 are input to the input selection circuit 403. The output of the input selection circuit 403 and the enable signal REN3 are input to the input selection circuit 404. The output of the input selection circuit 404 and the enable signal REN0 are input to the input selection circuit 405. The output of the input selection circuit 405 and the enable signal REN5 are input to the input selection circuit 406. The output of the input selection circuit 406 and the enable signal REN6 are input to the input selection circuit 407. The output of the input selection circuit 406 and the enable signal REN7 are input to the input selection circuit 407.

With this structure, the read data that is output from a selected bank can be appropriately supplied to the read/write bus 25b, without the use of a bank address in the interface chip IF as in the case illustrated in FIG. 9.

Figure 11:
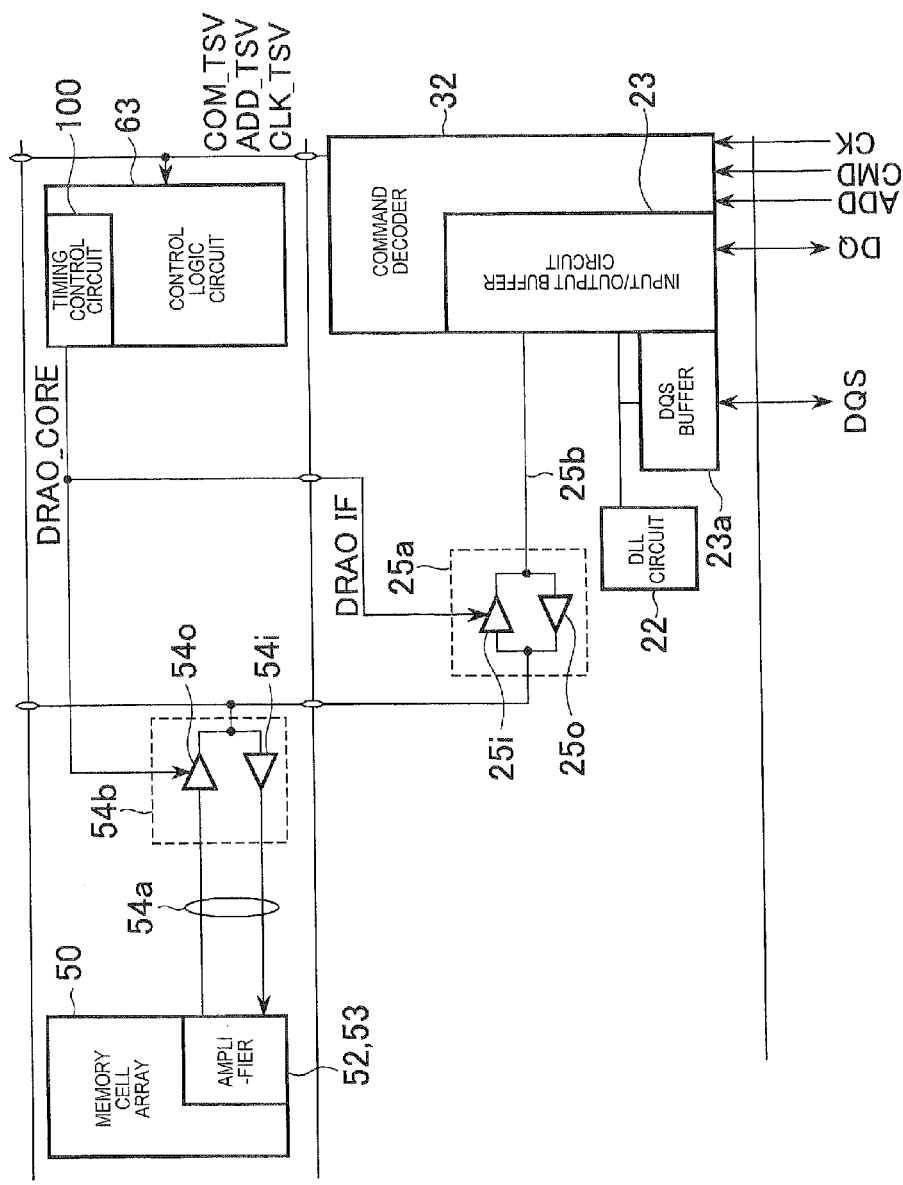
FIG. 11 is a block diagram illustrating a fifth embodiment of the present invention.

FIG. 11 is a block diagram illustrating a fifth embodiment of the present invention.

The aspects of the fifth embodiment that differ from the first embodiment are mainly described herein. This embodiment is an embodiment preferred in a case where there is only one core chip. Where there is only one core chip CC as shown in FIG. 11, there is no need to use the buffers BUFi shown in FIG. 5, and a timing signal DRAG is supplied directly to the interface chip IF. In the interface chip IF, the timing signal DRAG is supplied directly to the data input circuit 25i.

Figure 12:
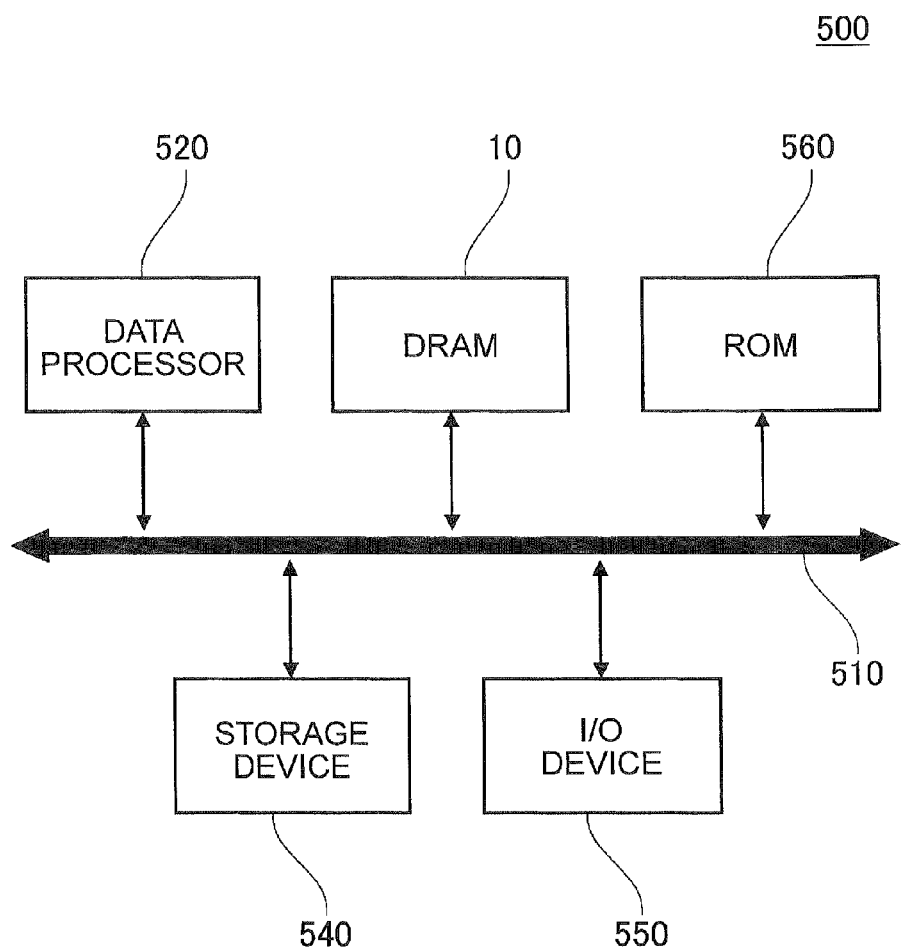
FIG. 12 is a diagram showing the configuration of a data processing system using the semiconductor memory device according to this embodiment.

FIG. 12 is a diagram showing the configuration of a data processing system 500 using the semiconductor memory device according to these embodiments.

The data processing system 500 shown in FIG. 12 has a configuration such that a data processor 520 and a semiconductor device (DRAM) 10 according to the present embodiments are mutually connected via a system bus 510. Examples of the data processor 520 include, but are not limited to, a microprocessor (MPU) and a digital signal processor (DSP). In FIG. 12, for the sake of simplification, the data processor and the DRAM 530 are connected via the system bus 510. However, these components can be connected by a local bus rather than being connected via the system bus 510. The data processor 520 includes a memory controller for controlling the DRAM. A read command is issued from the data processor 520 to the DRAM 10 and a read data is output from the DRAM 10 to the data processor 520.

In FIG. 12, for the sake of simplification, only one set of system bus 510 is shown. However, the system buses 510 can be arranged via a connector or the like in series or in parallel according to need. In the memory-system data processing system shown in FIG. 12, while a storage device 540, an I/O device 550, and a ROM 560 are connected to the system bus 510, these are not necessarily essential constituent elements.

Examples of the storage device 540 include a hard disk drive, an optical disk drive, and a flash memory. Examples of the I/O device 550 include a display device such as a liquid crystal display, and an input device such as a keyboard and a mouse.

Regarding the I/O device 550, it is only necessary to provide either one of the input device or the output device. Further, for the sake of simplicity, each constituent element shown in FIG. 12 is shown one each. However, the number is not limited to one, and a plurality of one or two or more constituent elements can be provided.

In the embodiments of the present invention, the controller issues commands concerning read commands to the interface chip. Upon receipt of a command from the controller, the interface chip issues read commands to core chips. Upon receipt of a read command, one of the core chips outputs read data that is the information about the memory cell array corresponding to the read command, to the interface chip. Receiving the read data from the one of the core chips, the interface chip outputs the read data to the controller. The commands (read commands in systems) issued by the controller are commands that are standardized by industry organizations specializing in controlling known semiconductor devices. The read commands issued from the interface chip to the core chips are control signals inside the semiconductor chips. The same goes for the read data.

It is apparent that the present invention is not limited to the above embodiments, but may be modified and changed without departing from the scope and spirit of the invention.

For example, in the embodiment, the DDR3-type SDRAMs are used as the plural core chips having the same function. However, the present invention is not limited thereto. Accordingly, the core chip may be a DRAM other than the DDR3-type and a semiconductor memory (SRAM (Static Random Access Memory), PRAM (Phase-change Random Access Memory), MRAM (Magnetic Random Access Memory) or a flash memory) other than the DRAM. The core chips may be plural semiconductor chips that have functions other than the functions of the semiconductor memory, which are equal to or different from each other. All of the core chips do not need to be laminated and all or part of the core chips may be two-dimensionally disposed. The number of core chips is not restricted to 8.

The fundamental technical concept of the present invention is not limited to that. For example, the core chips have been described as chips of semiconductor memories having the same function. However, the fundamental technical concept of the present invention is not limited to that, and the core chips may have the same function as one another or different functions from one another. Specifically, the interface chip and the core chips may be silicon chips each having a unique function. For example, the core chips may be DSP chips having the same function, and may have an interface chip (ASIC) shared among the core chips. Preferably, the core chips have the same function as one another, and are manufactured with the use of the same mask. However, the characteristics after the manufacture might vary due to the in-plane distribution in the same wafer, differences among wafers, differences among lots, and the likes. Further, the core chips each have a memory function, but may also have different functions from one another (a first core chip is a DRAM, a second chip is a SRAM, a third chip is a nonvolatile memory, and a fourth chip is a DSP). The core chips may be manufactured with the use of different manufacturing masks from one another, and may have an interface chip (ASIC) shared among the core chips.

The present invention may also be applied to all semiconductor products such as CPUs (Central Processing Units), MCUs (Micro Control Units), DSPs (Digital Signal Processors), ASICs (Application Specific Integrated Circuits), and ASSPs (Application Specific Standard Circuits), as long as they are COCs (Chip-on-Chips) that use TSVs. The devices to which the present invention is applied may also be used as the semiconductor devices in SOCs (System-on-Chips), MCPs (Multi Chip Packages), POPs (Package-On-Packages), and the likes.

The transistors may be field effect transistors (FETs) or bipolar transistors. The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI (Silicon on Insulator) structure, or a semiconductor substrate of some other type.

Further, the circuit forms of various circuits (such as amplifiers, drivers, receivers, FIFO, MUX, DQ drivers (DQS drivers), counters, and DLL circuits) are not limited to the circuit forms disclosed in the embodiments.

Further, the structures of TSVs are not particularly limited. Further, the circuit forms of the TSV buffers (drivers and receivers) are not particularly limited.

Various combinations and selections of the components disclosed herein may be made within the scope of the invention. In other words, the present invention of course includes various changes and modifications that are obvious to those skilled in the art according to all the disclosure including the claims and the technical concept.

What is claimed is:
1. A device comprising:
a first semiconductor chip that comprises:
a plurality of first terminals;
a plurality of second terminals;
a plurality of first memory blocks each including a plurality of first memory cells, each of the first memory blocks being configured to be accessed to produce first data;
a plurality of first circuits each producing a first output timing control signal;
a plurality of first buffers each coupled to an associated one of the first terminals, an associated one of the first memory blocks and an associated one of the first circuits and configured to respond to the first output timing control signal produced from the associated one of the first circuits to drive the associated one of the first terminals in accordance with the first data produced from the associated one of the first memory blocks; and
a plurality of second buffers each coupled to an associated one of the second terminals and an associated one of the first circuits and configured to respond to the first output timing control signal produced from the associated one of the first circuits to drive the associated one of the second terminals;
a second semiconductor chip that comprises:
a plurality of first through-vias each penetrating the second semiconductor chip and having first and second ends;
a. plurality of second through-vias each penetrating the second semiconductor chip and having third and fourth ends;
a plurality of second memory blocks each including a plurality of second memory cells, each of the second memory blocks being configured to be accessed to produce second data;
a plurality of second circuits each producing a second output timing control signal;
a plurality of third buffers each coupled to an associated one of the first through-vias, an associated one of the second memory blocks and an associated one of the second circuits and configured to respond to the second output timing control signal produced from the associated one of the second circuits to drive the associated one of the first through-vias in accordance with the second data produced from an associated one of the second memory blocks; and
a plurality of fourth buffers each coupled to an associated one of the second through-vias and an associated one of the second circuits and configured to respond to the second output timing control signal produced from the associated one of the second circuits to drive the associated one of the second through-vias; and
a third semiconductor chip that comprises:
a plurality of third terminals; and
a plurality of fourth terminals;
wherein the first and second semiconductor chips are stacked with each other such that each of the first terminals is connected to the first end of an associated one of the first through vias and each of the second terminals is connected to the third end of an associated one of the second through-vias; and
wherein the third semiconductor chip is coupled to the second semiconductor chip such that each of the third terminals is electrically connected to the second end of an associated one of the first through-vias and each of the fourth terminals is electrically connected to the fourth end of an associated one of the second through-vias.

2. The device as claimed in claim 1, wherein the third semiconductor chip is supplied at each of the third terminals with a data signal responsive to a selected one of the first and second data and at each of the fourth terminals with a timing signal responsive to a selected one of the first and second output timing control signals.

3. The device as claimed in claim 1, wherein the first semiconductor chip further comprises a plurality of third through-vias each penetrating the first semiconductor chip and having fifth and sixth ends and a plurality of fourth through-vias each penetrating the first semiconductor chip and having seventh and eighth ends, each of the first terminals being provided on the fifth end of an associated one of the third through vias, and each of the second terminals being provided on the seventh ends of an associated one of the fourth through-vias.

4. The device as claimed in claim 1, wherein each of the first through-vias is physically close to an associated one of the second through-vias.

5. The device as claimed in claim 3, wherein each of the first through-vias is physically close to an associated one of the second through-vias and each of the third through-vias is physically close to an associated one of the fourth through-vias.

6. The device as claimed in claim 5, wherein each of the first through-vias is vertically aligned with an associated one of the third through-vias, and each of the second through-vias is vertically aligned with an associated one of the fourth through-vias.

7. A device comprising:
a first semiconductor chip that comprises:
  a plurality of first terminals;
  a plurality of second terminals;
  a plurality of first memory banks each including a plurality of first memory cells, each of the first memory banks being configured to produce first data read out from a selected one of the first memory cells;
  a plurality of first buffers each configured to drive, when the first semiconductor chip selected, an associated one of the first terminals to produce a first data signal thereon in response to the first data; and
  a plurality of second buffers each configured to drive, when the first semiconductor chip is selected, an associated one of the second terminals to assert a first control signal that indicates the first data signal on the associated one of the first terminals being valid; and
a second semiconductor chip that comprises:
  a plurality of third terminals;
  a plurality of fourth terminals;
  a plurality of second memory banks each including a plurality of second memory cells, each of the second memory banks being configured to produce second data read out from a selected one of the second memory cells;
  a plurality of third buffers each configured to drive, when the second semiconductor chip selected, an associated one of the third terminals to produce a second data signal thereon in response to the second data;
  a plurality of fourth buffers each configured to drive, when the second semiconductor chip selected, an associated one of the fourth terminals to assert a second control signal that indicates the second data signal on the associated one of the third terminals being valid;
  a plurality of first through-vias each penetrating the second semiconductor chip and including first and second ends, the first end of each of the first through-vias being connected to an associated one of the third terminals; and
  a plurality of second through-vias each penetrating the second semiconductor chip and including third and fourth ends, the third end of each of the second through-vias being connected to an associated one of the fourth terminals; and
the first and second semiconductor chips being stacked with each other such that each of the first terminals is connected to the second end of an associated one of the first through-vias and each of the second terminals is connected to the fourth end of an associated one of the second through-vias.

8. The device as claimed in claim 7, further comprising a third semiconductor chip that comprises a plurality of fifth terminals and a plurality of sixth terminals, each of the fifth terminals being electrically connected to an associated one of the third terminals, and each of the sixth terminals being electrically connected to an associated one of the fourth terminals.

9. The device as claimed in claim 8, wherein:
when the first semiconductor chip is selected, the third semiconductor chip is supplied at at least one of the fifth terminals with the first data signal and at an associated one of the sixth terminals with the first control signal; and
when the second semiconductor chip is selected, the third semiconductor chip is supplied at at least one of the fifth terminals with the second data signal and at an associated one of the sixth terminals with the second control signal.

10. The device as claimed in claim 9, wherein the first semiconductor chip further comprises a plurality of third through-vias each penetrating the first semiconductor chip and having fifth and sixth ends and a plurality of fourth through-vias each penetrating the first semiconductor chip and having seventh and eighth ends, each of the first terminals being provided on the fifth end of an associated one of the third through-vias, and each of the second terminals being provided on the seventh ends of an associated one of the fourth through-vias.

11. The device as claimed in claim 10, wherein each of the first through-vias is physically close to an associated one of the second through-vias and each of the third through-vias is physically close to an associated one of the fourth through-vias.

12. The device as claimed in claim 11, wherein each of the first through-vias is vertically aligned with an associated one of the third through-vias, and each of the second through-vias is vertically aligned with an associated one of the fourth through-vias.

* * * * *